(12) United States Patent
Beall et al.

(10) Patent No.: US 9,640,621 B2
(45) Date of Patent: May 2, 2017

(54) GLASS-CERAMIC SUBSTRATES FOR SEMICONDUCTOR PROCESSING

(71) Applicant: Corning Incorporated, Corning, NY (US)

(72) Inventors: George Halsey Beall, Big Flats, NY (US); James Gregory Couillard, Ithaca, NY (US); Sasha Marjanovic, Painted Post, NY (US); Gregory Albert Merkel, Corning, NY (US)

(73) Assignee: Corning Incorporated, Corning, NY (US)

( * ) Notice: Subject to any disclaimer, the term of this patent is extended or adjusted under 35 U.S.C. 154(b) by 309 days.

(21) Appl. No.: 13/928,624

(22) Filed: Jun. 27, 2013

(65) Prior Publication Data
US 2014/0001485 A1    Jan. 2, 2014

Related U.S. Application Data

(60) Provisional application No. 61/666,385, filed on Jun. 29, 2012.

(51) Int. Cl.
*H01L 29/201* (2006.01)
*C03C 10/00* (2006.01)
(Continued)

(52) U.S. Cl.
CPC .......... *H01L 29/201* (2013.01); *C03C 3/062* (2013.01); *C03C 3/087* (2013.01);
(Continued)

(58) Field of Classification Search
CPC .............. H01L 29/201; H01L 21/0242; H01L 21/02458; H01L 21/02422;
(Continued)

(56) References Cited

U.S. PATENT DOCUMENTS 4,187,115 A    2/1980  Reade .................... 106/39.8
6,245,411 B1   6/2001  Goto et al. .............. 428/141
(Continued)

FOREIGN PATENT DOCUMENTS

JP    03924728 B2   6/2007
WO    9730001 A1    8/1997
(Continued)

OTHER PUBLICATIONS

Nakamura et al. ("InGaN/GaN/AlGaN-based laser diodes with an estimated lifetime of longer than 10,000 hours", Mat. Res. SoC. Symp. Proc. vol. 482, 1998, pp. 1145-1156.*
(Continued)

*Primary Examiner* — Jonathan Langman
(74) *Attorney, Agent, or Firm* — Zachary J. Wegmann

(57) ABSTRACT

Embodiments are directed to glass-ceramic substrates with a III-V semiconductor layer, for example, a GaN layer that can be used in LED lighting devices. The glass-ceramics material is in the anorthite-rutile ($CaAl_2Si_2O_8+TiO_2$) family or in the cordierite-enstatite ($SiO_2$—$Al_2O_3$—$MgO$—$TiO_2$) family.

15 Claims, 3 Drawing Sheets

(51) Int. Cl.

| | | |
|---|---|---|
| *C03C 3/062* | (2006.01) | |
| *C03C 3/087* | (2006.01) | |
| *C03C 17/22* | (2006.01) | |
| *H01L 21/02* | (2006.01) | |
| *H01L 33/00* | (2010.01) | |

(52) U.S. Cl.
CPC ...... *C03C 10/0036* (2013.01); *C03C 10/0045* (2013.01); *C03C 17/22* (2013.01); *C03C 17/225* (2013.01); *C03C 2217/28* (2013.01); *C03C 2217/281* (2013.01); *H01L 21/0242* (2013.01); *H01L 21/02422* (2013.01); *H01L 21/02458* (2013.01); *H01L 21/02538* (2013.01); *H01L 33/007* (2013.01)

(58) Field of Classification Search
CPC ............. H01L 21/02538; H01L 33/007; C03C 10/0036; C03C 10/0045; C03C 3/062; C03C 3/087; C03C 17/22; C03C 17/225; C03C 2217/28; C03C 2217/281
See application file for complete search history.

(56) References Cited

U.S. PATENT DOCUMENTS

| | | | |
|---|---|---|---|
| 6,994,903 B2 | 2/2006 | Hsu et al. | |
| 7,465,687 B2 | 12/2008 | Beall | |
| 7,531,428 B2 | 5/2009 | Dupont | |
| 7,902,045 B2 | 3/2011 | Arena et al. | |
| 2002/0193229 A1* | 12/2002 | Miyahara | B32B 18/00 501/32 |
| 2004/0018929 A1* | 1/2004 | Zou | C03C 10/0045 501/5 |
| 2005/0096208 A1* | 5/2005 | Zachau | C03C 10/0045 501/9 |
| 2006/0163605 A1* | 7/2006 | Miyahara | C04B 35/453 257/103 |
| 2009/0101924 A1* | 4/2009 | Bhat et al. | 257/94 |
| 2010/0307552 A1 | 12/2010 | Kohnke et al. | |
| 2011/0156212 A1 | 6/2011 | Arena | |
| 2011/0180906 A1 | 7/2011 | Wessels et al. | |
| 2012/0146023 A1 | 6/2012 | Craft et al. | 257/51 |
| 2013/0157445 A1 | 6/2013 | Miyashita et al. | 438/478 |

FOREIGN PATENT DOCUMENTS

| | | |
|---|---|---|
| WO | 2008088559 A1 | 7/2008 |
| WO | 2009077538 A2 | 6/2009 |
| WO | 2010036622 A1 | 4/2010 |

OTHER PUBLICATIONS

PCT Application No. PCT/US13/045299, filed Jun. 12, 2013, PCT Search Report dated Sep. 18, 2013.

L. Liu, et al., "Substrates for gallium nitride epitaxy", *Materials Science and Engineering R*, 2002, vol. 37, pp. 61-127.

* cited by examiner

GLASS-CERAMIC SUBSTRATES FOR SEMICONDUCTOR PROCESSING

CROSS-REFERENCE TO RELATED APPLICATIONS

This application claims the benefit of priority under 35 U.S.C. §119 of U.S. Provisional Application Ser. No. 61/666,385 filed on Jun. 29, 2012, the entire content of which is hereby incorporated by reference.

BACKGROUND

Field

Embodiments are directed to glass-ceramic substrates and more particularly to glass-ceramic substrates useful for Gallium Nitride (GaN) thin film growth.

Technical Background

Light emitting diodes (LEDs) have been commercialized for more than twenty years and have desirable attributes including energy efficiency, safety, small size, and long lifetime. Gallium nitride is a major material for LED manufacture.

Currently sapphire ($Al_2O_3$) and silicon are the typical materials used for LED substrates. Both have good chemical and thermal durability. However, sapphire is available in a limited quantity and in sizes smaller than 100 millimeters (mm) diameter, whereas silicon is available in sizes up to 300 mm in diameter. Furthermore, both materials differ significantly from GaN in their coefficient of thermal expansion (CTE). This mismatch results in substrate bow during growth and/or a high level of defects in the GaN crystal quality.

An alternative substrate with good CTE match to GaN, while also having good thermal stability (to 1100° C.), chemical durability, and surface polish characteristics would be advantageous.

SUMMARY

Embodiments describe a glass-ceramic substrate suitable for layer transfer and epitaxy. The substrate is prepared in the glassy state, formed to the desired shape, and then cerammed to crystallize. After crystallization the substrate is polished to the desired surface roughness, and/or a planarization layer is applied. The substrate can then be used as a recipient for transfer of, for example, a crystalline GaN seed layer. The seed layer provides a template for epitaxial growth of thicker layers at elevated temperatures such as by chemical vapor deposition. After further processing into devices, the substrate may optionally be removed by grinding and polishing to release the devices.

Corning has recently developed two composition families of glass-ceramics which exhibit close CTE match to GaN. In addition these materials have the desired characteristics of being thermally stable to 1100° C. and low surface roughness after polishing. They can be removed after the LED fabrication process by grinding and polishing. These materials can therefore represent a step change in GaN manufacturing capability.

Embodiments may have one or more of the following advantages: Currently sapphire ($Al_2O_3$) and silicon are the dominant materials for LED substrates. Both have good chemical and thermal durability. However sapphire is only available in limited quantify and sizes smaller than 100 mm diameter, whereas silicon is available in sizes up to 300 mm in diameter. Furthermore both materials differ significantly from GaN in their coefficient of thermal expansion (CTE). This mismatch results in substrate bow during growth and/or a high level of defects in the GaN crystal quality.

The glass-ceramic compositions described herein have been tailored to match the CTE of GaN. They therefore are advantaged over silicon and sapphire for film defects and warp. Because they are cerammed at high temperature, they are more thermally stable than other materials such as glasses, which would not withstand the 1100° C. use temperature. Their small grain size allows the surfaces to be polished to the level required for layer transfer and epitaxy. Because the material is prepared in the glassy state, the technology is scalable to larger wafer sizes and volumes.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

Figure 1:
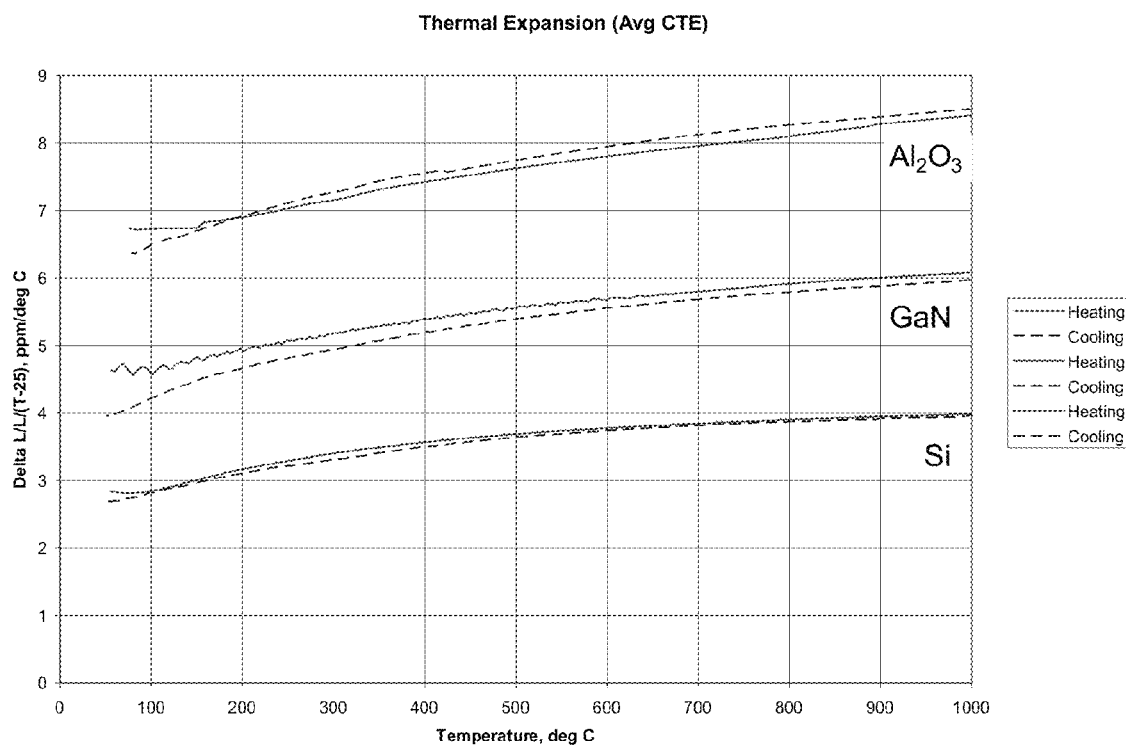
FIG. 1 is a graph showing average thermal expansion of state-of-the-art substrates for GaN growth.
Figure 2:
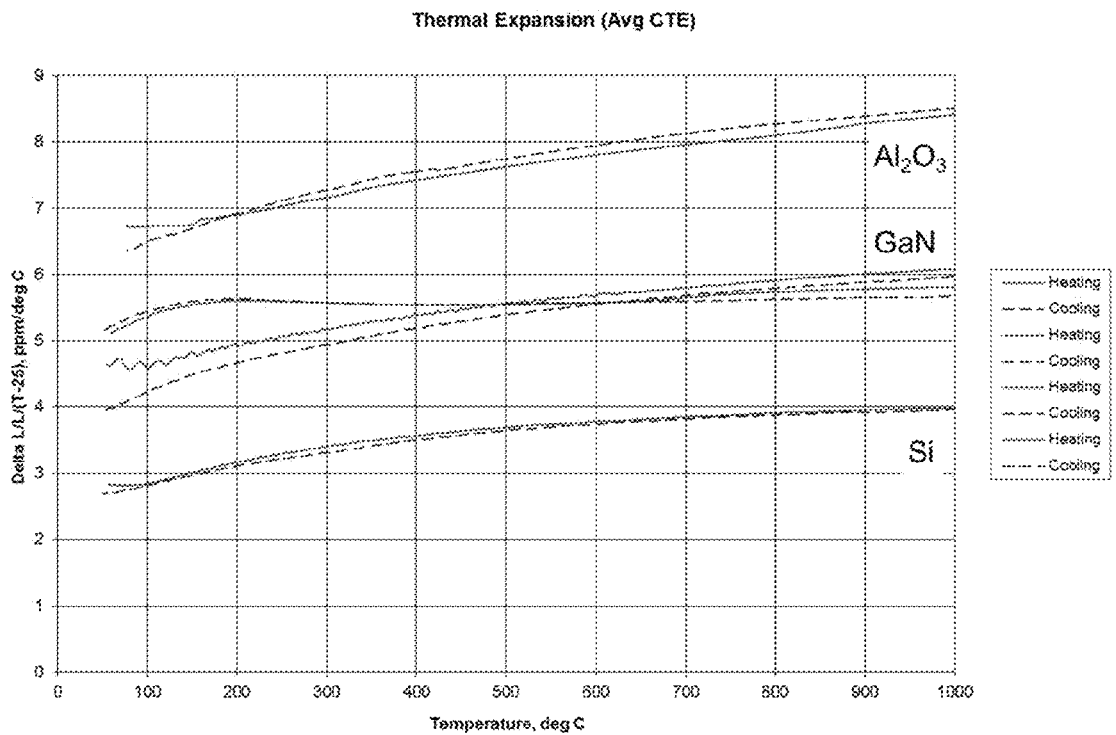
FIG. 2 is a graph showing average thermal expansion of one exemplary glass-ceramic from the anorthite-rutile family, compared to GaN.
Figure 3:
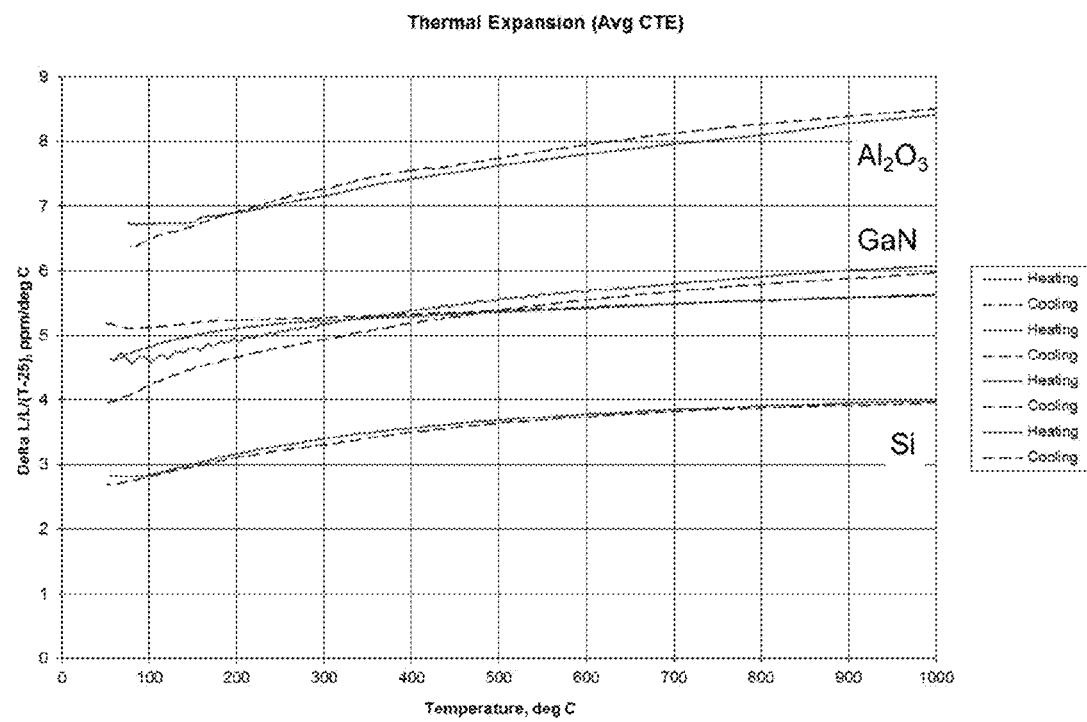
FIG. 3 is a graph showing average thermal expansion of a second exemplary glass-ceramic from the anorthite-rutile family, compared to GaN.
Figure 4:
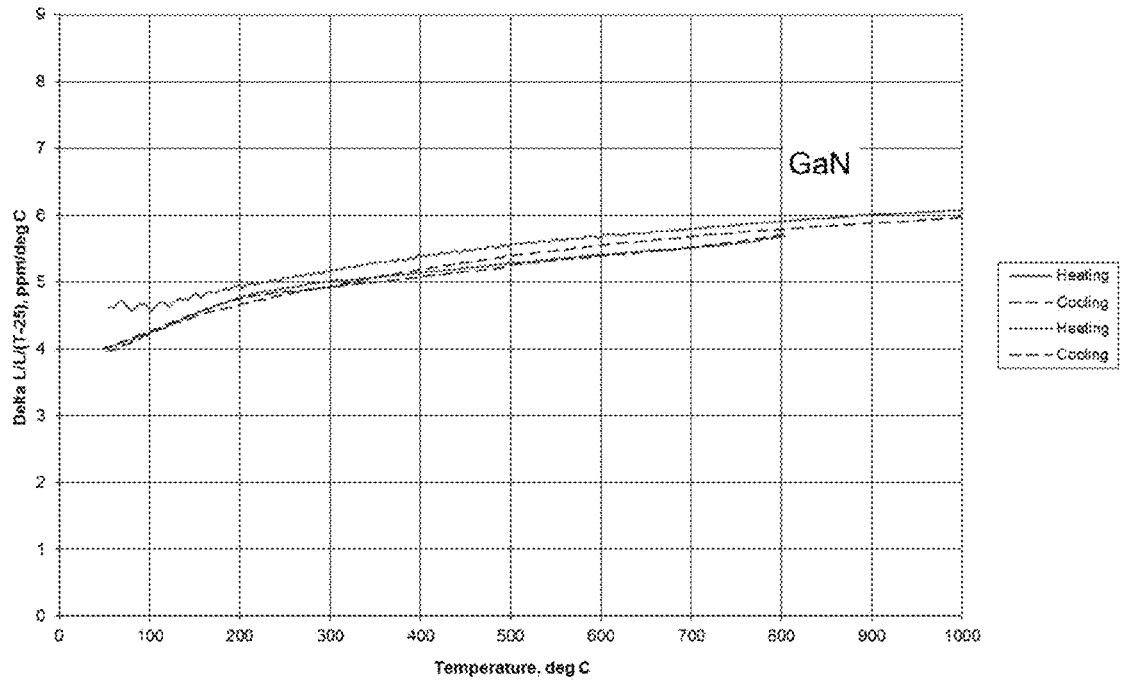
FIG. 4 is a graph showing average thermal expansion of a glass-ceramic from the cordierite-enstatite family, compared to GaN.

Reference will now be made in detail to various embodiments of glass-ceramics and their use in LED articles, examples of which are illustrated in the accompanying drawings. Whenever possible, the same reference numerals will be used throughout the drawings to refer to the same or like parts.

One embodiment is an article comprising a glass-ceramic substrate; and a layer comprising a III-V semiconductor disposed on a surface of the substrate, wherein the substrate comprises an anorthite-rutile ($CaAl_2Si_2O_8+TiO_2$) or a cordierite-enstatite ($SiO_2$—$Al_2O_3$—MgO—$TiO_2$) material. The III-V semiconductor can comprise Al, Ga, In, or combinations thereof and N, P, As, or combinations thereof. The III-V semiconductor can be GaN, GaP, AlGaAs, InGaAs, InGaN, AlGaP, or a combination thereof. The III-V semiconductor in one embodiment is GaN.

Another embodiment is an article comprising a glass ceramic substrate; and a layer comprising GaN disposed on a surface of the substrate, wherein the substrate comprises an anorthite-rutile ($CaAl_2Si_2O_8+TiO_2$) or a cordierite-enstatite ($SiO_2$—$Al_2O_3$—MgO—$TiO_2$) material.

The substrate can be crystalline phase throughout 80 percent or more of its volume, for example, 90 percent or more. The crystalline phase can be dispersed throughout the volume. The substrate can be glassy phase throughout 20 percent or less of its volume, for example, 10 percent or less. The glassy phase can be dispersed throughout the volume. The substrate can be, for example, 80 percent or more crystalline phase and 20 percent or less glassy phase.

In one embodiment, the CTE of the GaN layer and the substrate are within ±5×10-7 of each other. The CTE of the substrate and the layer are both 60×10-7.

The surface can have an average roughness of 100 nm or less, for example, 50 nm or less. The substrate can have an average grain size of 5 microns or less, for example, 4 microns or less, 3 microns or less, 2 microns or less, 1 microns or less, 0.5 microns or less.

In one embodiment, the substrate is alkali free. The substrate can be Au, Pd, Ag, or Pt free, for example, Au, Pd, Ag, and Pt free. The substrate can be As free. In one embodiment, less than 500 ppm of each of Ni, Na, Cu, Fe, Cr, Ca, Ti, K, Mg, or Zn diffuse out of the substrate, for example, during subsequent device processing at elevated temperatures or immersion in wet chemical solutions.

In one embodiment, the substrate comprises in weight percent: 15-20 CaO, 35-40 $Al_2O_3$, 35-40 $SiO_2$, and 12-16 $TiO_2$.

In a further embodiment, the substrate comprises in weight percent: 40-55 $SiO_2$, 10-15 $Al_2O_3$, 20-30 MgO, 1-5 CaO, and 5-15 $TiO_2$.

In a still further embodiment, the substrate comprises in weight percent: 45-50 $SiO_2$, 10-15 $Al_2O_3$, 20-30 MgO, 1-5 CaO, and 5-15 $TiO_2$.

In one embodiment, the substrate can have a thickness of 5 mm or less, for example, 4 mm or less, for example, 3 mm or less, for example, 2 mm or less, for example, 1 mm or less, for example, 0.5 mm or less. The substrate can have a thickness in the range of from 0.5 mm to 4 mm.

The glass-ceramic substrate can be from the anorthiter-utile ($CaAl_2Si_2O_8+TiO_2$) family. The composition is given in oxide weight percent for two examples in Table 1. Of these, the composition in Example 2 is stoichiometric. The oxide mixtures were melted at 1650° C. for 16 hours, then poured into forms and annealed at 750° C. The forms were annealed at 900° C. over eight hours to nucleate, and then crystallized at 1250° C. for four hours.

TABLE 1

| wt % | Example 1 | Example 2 |
|---|---|---|
| CaO | 16.8 | 17.19 |
| $Al_2O_3$ | 31.8 | 31.26 |
| $SiO_2$ | 36.7 | 36.84 |
| $TiO_2$ | 14.7 | 14.7 |

In a another embodiment, the glass-ceramic is from the cordierite-enstatite ($SiO_2$—$Al_2O_3$—MgO—$TiO_2$) family. The composition in Example 3 is given in oxide weight percent in Table 2. The oxide mixtures were melted at 1650° C. for 16 hours, then poured into forms and annealed at 750° C. The forms were annealed at 850° C. four two hours to nucleate, and then crystallized at 1350~1425° C.

TABLE 2

| wt % | Example 3 |
|---|---|
| $SiO_2$ | 48.7 |
| $Al_2O_3$ | 13.8 |
| MgO | 25.2 |
| CaO | 1.5 |
| $TiO_2$ | 10.8 |

After crystallization, the forms of all three compositions were shaped into wafers and polished.

Figure 5:
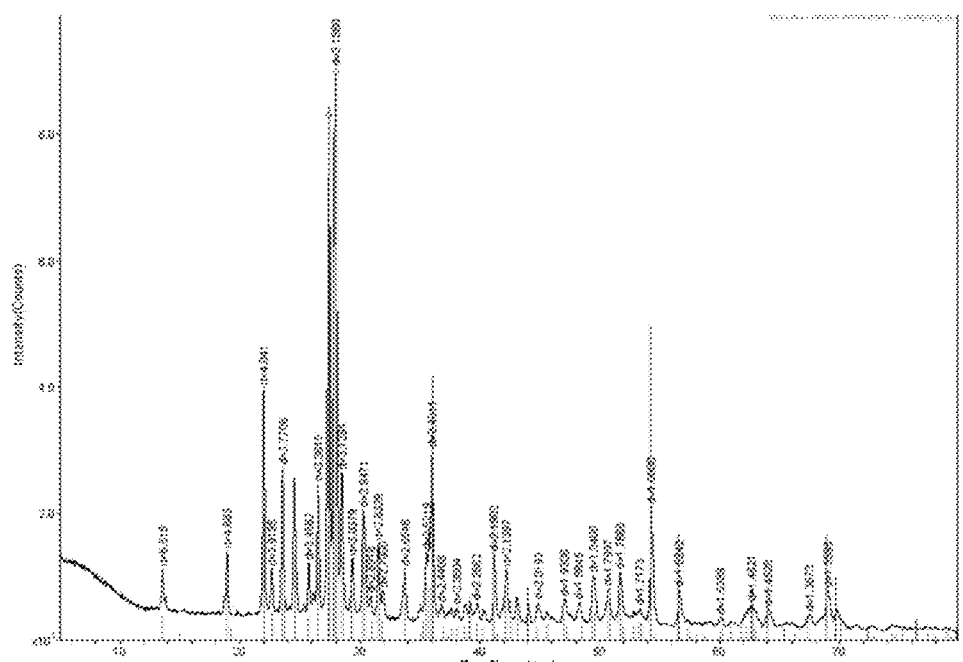
FIG. 5 is a graph showing X-Ray Diffraction (XRD) data of Example 2 in its final, crystallized state.

FIG. 5 is a graph showing X-Ray Diffraction (XRD) data of Example 2 in its final, crystallized state. The data shows two crystalline phases anorthite and rutile, as well as some residual glass presence (advantageous for amortization of CTE mismatch induced stresses).

Figure 6A:
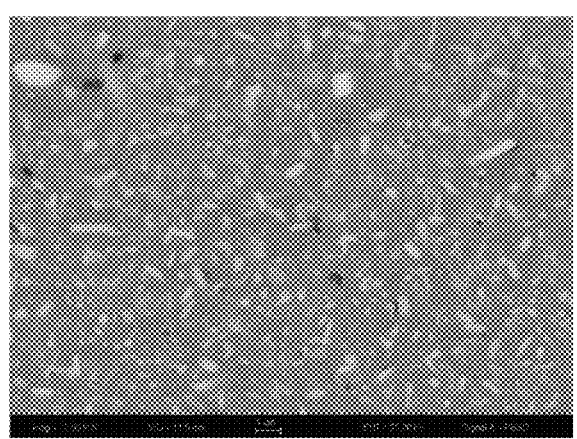
FIGS. 6A and 6B are top down Secondary Electron Microscopy (SEM) and Atomic Force Microscopy (AFM) images, respectively, showing crystal grain size of about 1 micron or less.
Figure 6B:
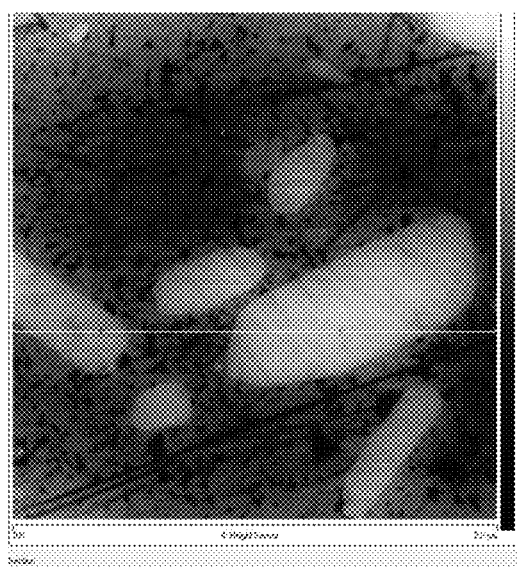

FIGS. 6A and 6B are top down Secondary Electron Microscopy (SEM) and Atomic Force Microscopy (AFM) images, respectively, showing crystal grain size of about 1 micron or less. This is advantageous for surface finishing due to GaN deposition process requirements—surface must be perfectly smooth.

The GaN on the substrate or alone can be used to fabricate LED lights in, for example, fabrication processes such as wafer sized processes, for example, 6 inches by 6 inches or even larger. Multiple LEDs can be fabricated on the GaN and separated into single LEDs after fabrication.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. An article comprising a glass-ceramic substrate; and a layer comprising a III-V semiconductor disposed on a surface of the substrate, wherein the substrate comprises a cordierite-enstatite ($SiO_2$—$Al_2O_3$—MgO—$TiO_2$) material having a coefficient of thermal expansion (GTE) of $60\times10^{-7}\pm5\times10^{-7}$, and further wherein the cordierite-enstatite material comprises in weight percent:
   40-55 $SiO_2$;
   10-15 $Al_2O_3$;
   20-30 MgO;
   1-5 CaO; and
   5-15 $TiO_2$
   wherein the III-V semiconductor is GaN, GaP, AlGaAs, InGaAs, InGaN, AlGaP, or a combination thereof.

2. The article according to claim 1, wherein the substrate is crystalline phase throughout 80 percent or more of its volume.

3. The article according to claim 2, wherein the crystalline phase is dispersed throughout the volume.

4. The article according to claim 1, wherein the substrate is glassy phase throughout 20 percent or less of its volume.

5. The article according to claim 4, wherein the glassy phase is dispersed throughout the volume.

6. The article according to claim 1, wherein the CTE of the layer and the substrate are within $\pm5\times10^{-7}$ of each other.

7. The article according to claim 1, wherein the CTE of the substrate and the layer are both $60\times10^{-7}+5$.

8. The article according to claim 1, wherein the surface has an average roughness of 100 nm or less.

9. The article according to claim 1, wherein the substrate has an average grain size of 5 microns or less.

10. The article according to claim 1, wherein the substrate is alkali free.

11. The article according to claim 1, wherein the substrate is Au, Pd, Ag, or Pt free.

12. The article according to claim 1, wherein the substrate is Au, Pd, Ag, and Pt free.

13. The article according to claim 1, wherein the substrate is As free.

14. The article according to claim 1, wherein less than 500 ppm of each of Ni, Na, Cu, Fe, Cr, Ca, Ti, K, Mg, or Zn diffuse out of the substrate.

15. The article according to claim 1, wherein the substrate comprises a cordierite-enstatite material comprising in weight percent:
- 45-50 $SiO_2$;
- 10-15 $Al_2O_3$;
- 20-30 MgO;
- 1-5 CaO; and
- 5-15 $TiO_2$.

* * * * *